United States Patent
Goasguen

(10) Patent No.: US 10,431,985 B2
(45) Date of Patent: Oct. 1, 2019

(54) POWER MANAGEMENT METHOD

(71) Applicant: IMEON ENERGY, Brest (FR)

(72) Inventor: Christophe Goasguen, Brest (FR)

(73) Assignee: IMEON ENERGY, Brest (FR)

( * ) Notice: Subject to any disclaimer, the term of this patent is extended or adjusted under 35 U.S.C. 154(b) by 207 days.

(21) Appl. No.: 15/531,425

(22) PCT Filed: Dec. 2, 2015

(86) PCT No.: PCT/FR2015/053298
§ 371 (c)(1),
(2) Date: May 27, 2017

(87) PCT Pub. No.: WO2016/087781
PCT Pub. Date: Jun. 9, 2016

(65) Prior Publication Data
US 2017/0310112 A1  Oct. 26, 2017

(30) Foreign Application Priority Data
Dec. 2, 2014  (FR) ...................................... 14 61752

(51) Int. Cl.
*H02J 3/38* (2006.01)
*H02J 3/32* (2006.01)
(Continued)

(52) U.S. Cl.
CPC ........ *H02J 3/38* (2013.01); *H02J 3/32* (2013.01); *H02J 3/382* (2013.01); *H02J 3/386* (2013.01);
(Continued)

(58) Field of Classification Search
None
See application file for complete search history.

(56) References Cited

U.S. PATENT DOCUMENTS

2004/0232878 A1\* 11/2004 Couch ................ H02J 1/14
320/101
2009/0295227 A1\* 12/2009 Chang ................ H02J 3/32
307/46

(Continued)

FOREIGN PATENT DOCUMENTS

CN  103 280 840 A  9/2013

OTHER PUBLICATIONS

Pourmousavi et al., "A framework for real-time power management of a grid-tied microgrid to extend battery lifetime and reduce cost of energy," Innovative Smart Grid Technologies (ISGT), 2012 IEEE PES, Jan. 16, 2012, pp. 1-8, IEEE.

(Continued)

*Primary Examiner* — Jason Lin
(74) *Attorney, Agent, or Firm* — IM IP Law; C. Andrew Im; Chai Im

(57) ABSTRACT

A power management method includes measuring the voltage and the current of a power source, an electrical output and a battery. The power generated by the power source, the power consumed by the electrical output and the power exchanged with the battery are calculated. The power source, the electrical output, the battery and the electrical grid are connected. Measurements of electrical generation and information on the consumption and control possibility of one or more remote systems are transmitted to a monitoring device. The electrical output is connected to the power source, the battery or the electrical grid according to information on the tariff per kWh provided by the public electricity grid, such as peak and off-peak time.

11 Claims, 3 Drawing Sheets

(51) Int. Cl.
  *H02J 7/00* (2006.01)
  *H02J 7/35* (2006.01)
  *G01R 31/42* (2006.01)
  *H01H 47/00* (2006.01)

(52) U.S. Cl.
  CPC .............. *H02J 7/0031* (2013.01); *H02J 7/35* (2013.01); *G01R 31/42* (2013.01); *H01H 47/002* (2013.01); *H02J 2007/004* (2013.01); *H02J 2007/0037* (2013.01); *Y02E 10/763* (2013.01); *Y02E 70/30* (2013.01)

(56) References Cited

U.S. PATENT DOCUMENTS

| | | | | |
|---|---|---|---|---|
| 2011/0115295 A1* | 5/2011 | Moon | ........................ | H02J 3/32 307/65 |
| 2011/0140667 A1* | 6/2011 | Moon | ........................ | H02J 3/32 320/134 |
| 2011/0204720 A1* | 8/2011 | Ruiz | ................... | B60L 11/1816 307/66 |
| 2011/0291479 A1* | 12/2011 | Lee | ........................... | H02J 3/32 307/43 |
| 2012/0161523 A1* | 6/2012 | Kim | ..................... | H02J 13/0075 307/66 |
| 2012/0166013 A1* | 6/2012 | Park | ........................ | H02J 3/383 700/297 |
| 2013/0181519 A1* | 7/2013 | Lee | ........................... | H02J 3/28 307/24 |
| 2013/0241495 A1* | 9/2013 | Min | ......................... | H02J 3/32 320/134 |
| 2014/0025220 A1* | 1/2014 | Carlson | ............. | H01L 31/02021 700/296 |
| 2016/0196621 A1* | 7/2016 | Tokunaga | .............. | G06Q 50/06 705/7.25 |

OTHER PUBLICATIONS

Mercier et al., "Optimizing a Battery Energy Storage System for Frequency Control Application in an Isolated Power System," IEEE Transactions on Power Systems, Aug. 31, 2009, pp. 1469-1477, vol. 24, No. 3, IEEE Service Center, Piscataway, NJ, US.

* cited by examiner

POWER MANAGEMENT METHOD

RELATED APPLICATIONS

This application is a § 371 application from PCT/FR2015/053298 filed Dec. 2, 2015, which claims priority from French Patent Application No. 14 61752 filed Dec. 2, 2014, each of which is incorporated herein by reference in its entirety.

TECHNICAL FIELD OF THE INVENTION

The present invention relates to the field of renewable power sources, and more particularly to the use of renewable power generation in self-consumption.

BACKGROUND OF THE INVENTION

The following types of system are known: on grid and off grid.

On-grid systems are systems that generate power on an available electrical grid. With this type of system, it is possible only to inject the generated power into the grid. No storage is possible.

Off-grid systems are not connected to a public grid and are considered not to be linked to the main or national electrical grid. With this type of system, it is only possible to store and/or to self-consume the generated power. No injection into the grid is possible. In this type of system, it is necessary to use a load regulator which involves additional losses over the entire system.

Off-grid systems also use the all-or-nothing principle for electrical output, either by the batteries or by the public electricity grid. These power relays create brownouts when they transfer power from one source to another.

The power of off-grid inverters is identical at input and output, i.e. the aggregated power of the loads at output is limited.

An off-grid system consists of multiple elements, which involves complex wiring and a bulky system.

A power management method taking solar panels into consideration is known from document US2011/140667. The method described in this document makes it possible to control either the injection of electrical power from the solar panel or the battery into a residence or into the electrical grid, or the consumption of electrical power on the public electricity grid in order to charge the battery, according to a predetermined reference level of power consumed by the residence or the electrical grid. This method is designed so that the delivery point (the electricity meter of the public electricity grid) measures consumed power as constantly as possible throughout the day and does so under any conceivable circumstances relating to the power consumption of the residence or of the local electrical grid, the power generated by the solar panel and the power stored in the battery. Thus, the method injects current from the solar panel or the battery into the residence or the local electrical grid if the power consumed by the residence or the local electrical grid is more than the predetermined reference power. The method consumes current from the public electricity grid in order to charge the battery if the power consumed by the residence or the local electrical grid is less than the predetermined reference power. The method is composed of at least one battery cell using electrochemical accumulator technology.

However, this document does not teach how to optimize the management of power flows with the aim of decreasing the cost per kWh generated by the power source as much as possible. It does not include, for example, the possibility to:
use the power generated by the solar panels to supply power to the electrical output, the public electricity grid and to charge the battery at the same time;
charge the battery using both the power generated by photovoltaics and the public electricity grid at the same time;
supply the electrical output with the power generated by the solar panels, the battery and the public electricity grid at the same time;
supply the public electricity grid using the power generated by the solar panels and batteries at the same time.

It does not include the possibility to use batteries other than those employing electrochemical accumulator technology, such as, in particular, flywheel storage.

OBJECT AND SUMMARY OF THE INVENTION

The present invention aims to remedy these drawbacks.

To this end, according to a first aspect, an aim of the present invention is a power management method, characterized in that it includes the following steps:
a) measuring the voltage and the current of a power source, of an electrical output and of a battery;
b) calculating the power generated by the power source, the power consumed by the electrical output and the power exchanged with the battery;
c) connecting the power source, the electrical output, the battery and an electrical grid:
the power source is connected to the electrical output in order to supply it with power, if the power generated by the power source is higher than the power consumed by the electrical output;
the power source is connected to the battery in order to supply it with power, if the power generated by the power source is higher than the power exchanged with the battery; or
the power source is connected to the electrical grid;
d) transmitting, to a monitoring device, measurements of electrical generation and information on the consumption and control possibility of one or more remote systems;
e) the electrical output is connected to the power source, the battery or the electrical grid according to information on the tariff per kWh provided by the public electricity grid, such as peak and off-peak time, in which the electrical output is connected:
either to the power source, then to the battery if the power generated by the power source is lower than the power consumed by the electrical output, then to the electrical grid if the measurand of the state of charge of the battery in step a) expressed as a percentage is lower than the predetermined limit value, if the information on the tariff per kWh provided by the public electricity grid is high; or
to the power source, then to the electrical grid if the power generated by the power source is lower than the power consumed by the electrical output if the information on the tariff per kWh provided by the public electricity grid is low, then to the battery, if there is an outage on the electrical grid.

The term "electrical output" refers to an electricity-consuming element such as for example a bulb, a hot water cylinder, etc.

The term "electrical grid" refers to a public grid comprising a collection of energy infrastructures of varying availability that allow electrical power to be transported from power plants to consumers of electricity.

The terms "high" and "low" refer to the cost of electricity from the electrical grid; for example, in France, EDF® (registered trademark) proposes two tariffs depending on the time of day: peak tariff and off-peak tariff. Thus, in this example, the term "high" corresponds to "peak" and the term "low" corresponds to "off-peak".

The high tariff is 15.93 euro cents per kWh (peak). The low tariff is 10.48 euro cents per kWh (off-peak).

Thus, in this embodiment, the method controls the load according to tariff information. For example, the load control of the heating of the hot water cylinder is only carried out at off-peak times.

By virtue of these arrangements, the method makes it possible to optimize the management of power generation according to consumption, storage and availability of the grid. The method uses and orients generated power intelligently for optimum performance.

By virtue of these arrangements, the generated power is directly sent to the electrical grid without energy losses since it is not transferred to a battery. Specifically, the prior art teaches that in off-grid systems, the generated power is first transferred to batteries in order to charge them and only then is the power used to supply outputs. This principle of the prior art includes energy losses of the order of 20%.

The transmission makes it possible to consult the generation and the consumption of electricity in real time. There is then improved interaction with the public electricity grid.

Thus, the method makes it possible to control the method remotely in order to be able to change the priorities of the power flow or to change the options regarding the use of the power flow on demand by the end user without the intervention of a person skilled in the art. Thus, the end customer may, for example:
- change the timeslot in which the battery is charged by the grid, which option is essential in order to optimize the use of the battery according to the season;
- update the product with changes that make it possible to improve the efficiency of the product or to increase the options available with the product;
- change the time of the system when passing to or from daylight saving time.

It also includes the possibility for the operator of the public grid to receive information for the purpose of load control or load shedding with the aim of providing grid support in terms of power and stabilization of the voltage and of the frequency of the grid.

It also includes the possibility for the method to communicate with connected objects in order to be able to activate or to deactivate them for the purpose of load shedding or activating the load with the aim of providing grid support and stabilization.

It also includes the possibility to create virtual power plants which allow the installation of multiple intercommunicating units of the method with the aim of increasing the overall efficiency of the virtual power plant and the efficiency of grid support.

In one embodiment, when the power source supplies power to the electrical output, the method also comprises the following steps:
- calculating a first remaining power by subtracting the power consumed by the electrical output from the power generated by the power source;
- connecting the first remaining power to the battery in order to charge said battery, if the measurand of the state of charge of the battery in step a) expressed as a percentage is lower than a predetermined limit value and if the measurand of the first remaining power is higher than zero;
- calculating a second remaining power by subtracting the power exchanged with the battery from the first remaining power;
- connecting the second remaining power to the electrical grid, if the measurand of the second remaining power is higher than zero;
- connecting the first remaining power to the electrical grid if the measurand of the state of charge of the battery in step a) expressed as a percentage is higher than a predetermined limit value.

Thus the method makes it possible to increase the overall efficiency of generation of the power source and hence to decrease the cost per kWh consumed by supplying power directly to the electrical output and by charging the battery solely with the excess power generated by the power source. This principle prevents losses of efficiency due to various non-essential conversions.

In one embodiment, when the power source supplies power to the battery, the method also comprises the following steps:
- calculating a first remaining power by subtracting the power exchanged with the battery from the power generated by the power source;
- connecting the first remaining power to the electrical output, if the first remaining power is higher than the power consumed by the electrical output;
- calculating a second remaining power by subtracting the power consumed by the electrical output from the first remaining power;
- connecting the second remaining power to the electrical grid, if the measurand of the second remaining power is higher than zero.

Thus, the method makes it possible for countries having an unstable public electricity grid to be certain to have a full battery that may be depended upon in the case of a problem on the public electricity grid. It also makes it possible to supply power to the electrical output in the event that the power generation of the power source is higher than the maximum charging power or in the event that a battery is already fully charged.

In certain embodiments, the method comprises a step of measuring the electrical grid and if the measurand of the voltage of the electrical grid is higher than zero, then the predetermined limit value is between 30% and 55%, preferably 45% and 55%, and when the measurand of the voltage of the electrical grid is zero then the predetermined limit value is between 60% and 90%, preferably between 75% and 85%.

Thus, the method makes it possible to increase the lifespan of the battery when the public electricity grid is present and also to increase the duration of autonomy of the system in the event of a problem on the public electricity grid and to do so without the intervention of a person skilled in the art.

By virtue of these arrangements, the lifespan of the connected batteries is maintained and their longevity is increased. The use of two predetermined limit values (one of the order of 50% and the other of the order of 80%) allows the charge/discharge cycle of the battery to be optimized. Specifically, the charge/discharge cycles of the batteries are known to the provider and a simple discharge for a few minutes uses one cycle. In order to increase the lifespan of the battery, the battery is allowed to discharge under certain conditions. Thus, when there is an outage of the grid the batteries are discharged down to a deeper threshold (of the order of 80% of the voltage of the battery), thereby avoiding the overly frequent use of a battery cycle and substantially increasing the lifespan of the batteries. In the case in which the electrical grid is present, the lifespan of the batteries is favored. It is for this reason that the discharge threshold is lower (around 50% of the voltage of the battery).

In certain embodiments, the power source is a renewable power source, such as a solar panel, a wind turbine or marine power.

Thus, the method makes it possible to adapt to any major renewable power sources on the global market.

In certain embodiments, said method also comprises the following step:

in the case of a battery employing technology using a protection relay, a starter battery replaces the battery for a predetermined duration and information is sent to the battery in order to open its protection relay, if the measurand of the voltage of the battery is higher than a predetermined limit value and if the power consumed by the electrical output is lower than the power generated by the power source, or if the measurand of the voltage of the battery is lower than a predetermined limit value and if the power consumed by the electrical output is higher than the power generated by the power source for a predetermined duration.

Thus the method allows the installation of a starter battery in parallel to the main battery for use in the first instants (predetermined period) of a need to charge/discharge or in the event of switch-on peaks of a consumer of the electrical output and hence an increase in the lifespan of a lithium battery using power relays for protection without a great change in the cost of the system.

The vast majority of lithium batteries use power relays in order to protect the battery in the event of a problem (overcurrent, overvoltage, overheating, etc.). Power relays have a lifespan expressed in number of transitions (from open to closed and vice versa). The principle is therefore to limit the number of transitions of these relays.

In the case of a battery requiring a protection relay, this step makes it possible to decrease the number of times the protection relay of the battery is closed and hence to increase its efficiency and its lifespan.

BRIEF DESCRIPTION OF THE FIGURES

Other advantages, aims and features of the present invention will become apparent from the following description which is provided by way of completely non-limiting explanation and with reference to the appended figures, in which.

DESCRIPTION OF EXEMPLARY EMBODIMENTS OF THE INVENTION

Figure 1:
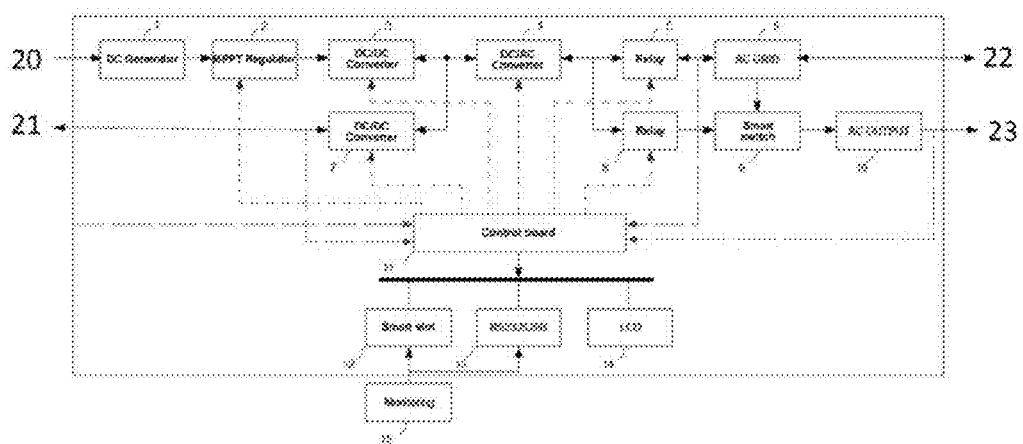
FIG. 1, schematically represents the principle of operation according to one particular embodiment of the method that is the subject of the present invention.

FIG. 1 schematically shows the principle of the invention. It represents a housing with the various elements that allow the method that is the subject of an exemplary embodiment of the invention to operate.

A power source 20 is connected to the input of the housing. In this exemplary embodiment, the power source is one or more photovoltaic panels. The power source becomes a DC voltage generator 1 via a light source. This voltage is subsequently regulated by an MPPT regulator 2, then boosted by a DC/DC converter 3 in order to be converted to an AC voltage by a DC/AC converter 4.

One of the outputs 21 is connected to a battery.

In this embodiment, there are multiple batteries. The batteries are recharged from the DC voltage generated by the photovoltaic panels using a reversible DC/DC converter 7 when the electrical output 23 is not consuming power. Measuring the voltage or the current of the electrical output makes it possible to determine whether or not it is consuming power. For example, a hot water cylinder operates by being alternately switched on and off.

In one exemplary embodiment, the DC/AC converter 4 is also supplied with power from the batteries via this same DC/DC converter 7 when the photovoltaic panels are not generating enough power.

The relays 5 and 8 are activated by the control board 11 which intelligently decides whether the generated power goes directly to the electrical output 23.

In this case, the power passes through the AC OUTPUT connector 10.

In one embodiment, the power source 20 is used to recharge the batteries when they are empty. In another exemplary embodiment, the power source 20 is used for the purpose of being injected into the electrical grid 22 by the grid connection connector 6.

The electrical output 23 first uses power arising from generation, then that which is stored in the batteries and lastly that from the electrical grid 22.

In one embodiment, the batteries are recharged using the leftover generated power which is not consumed by the electrical output 23 or by the electrical grid 22 depending on the timeslot. A choice will be made as to whether or not to charge the batteries at peak or off-peak times.

The smart switch 9 supplies a higher level of charge by coupling the power generated by the power source 20 and that of the electrical grid 22, when necessary.

Remaining with FIG. 1, a control board 11 controls all of the converters and measures the voltages at various points of the system. The measurements are shown in the figure by dashed arrows. For example, the measurements make it possible to determine the value of the voltage or of the current at the electrical output, at the battery or at the electrical source.

The smart slot 12 and the RS232/USB 13 ("RS232/USB" for serial port 232/universal serial bus) board are in communication with monitoring 15.

The LCD (liquid crystal display) screen 14 present on the face of the housing provides real-time visual information on the system to the owner of the set-up, for example: the voltage and current consumed by the electrical output or generated by the power source or the electrical grid.

The generation and consumption of electricity are measured in real time.

The term "real time" refers to the fact that the measurement of the generation or of the consumption of electricity is transmitted to or collected by the processing means without waiting until the end of a measurement.

Figure 2:
FIG. 2 schematically represents the principle from a macroscopic perspective.

FIG. 2 schematically represents the principle from a macroscopic perspective in order to show the various possible cases between the input and the outputs.

Various combinations are produced by the method according to the power generated (power source 20), the charge of the batteries 21 and the electricity consumed by the electrical output 23.

For example, below are embodiments relating to how the use of power generated by the power source, such as solar panels, is prioritized:

- the power generated by the photovoltaic panels is first used to supply power to the electrical output 23, then to charge the batteries 21 and the excess is injected into the electrical grid 22;
- the power generated by the photovoltaic panels is first used to charge the batteries 21, then to supply power to the output 23 and the excess is injected into the electrical grid 22;
- the power generated by the photovoltaic panels is first used to charge the batteries 21, then for the purpose of being injected into the electrical grid 22 and, in the case that the electrical grid 22 is absent, to supply power to the electrical output 23;
- the power generated by the photovoltaic panels is first used to supply power to the electrical output 23, then to charge the batteries 21. In this case, there is no injection into the electrical grid 22;
- the power generated by the photovoltaic panels is first used to charge the batteries 21, then to supply power to the electrical output 23. In this case, there is no injection into the electrical grid 22;
- all of the power generated by the photovoltaic panels is injected into the electrical grid 22.

Below are other exemplary embodiments relating to how the use of power supplied by the power source (power source 20, such as solar panels), by the batteries 21 or by the electrical grid 22 is prioritized in order to meet the electrical consumption:

- the power consumed at the electrical output 23 is first supplied by the photovoltaic panels, then by the batteries 21 if that generated by the photovoltaic panels is insufficient, then by the electrical grid 22 if the batteries 21 are empty;
- the power consumed at the electrical output 23 is first supplied by the photovoltaic panels, then by the electrical grid 22 if that generated by the photovoltaic panels is insufficient, then by the batteries 21 if the electrical grid 22 is unavailable;
- the power consumed at the electrical output 23 is first supplied by the photovoltaic panels, then:
  - if it is peak time for the electrical grid 22, by the batteries 21 if that generated by the photovoltaic panels is insufficient, then by the electrical grid 22 if the batteries 21 are empty;
  - if it is off-peak time for the electrical grid 22, by the electrical grid 22 if that generated by the photovoltaic panels is insufficient, then by the batteries 21 if the electrical grid 22 is unavailable.
- the power consumed at the electrical output 23 is not supplied if all of the power were to be injected into the electrical grid 22.

Figure 3:
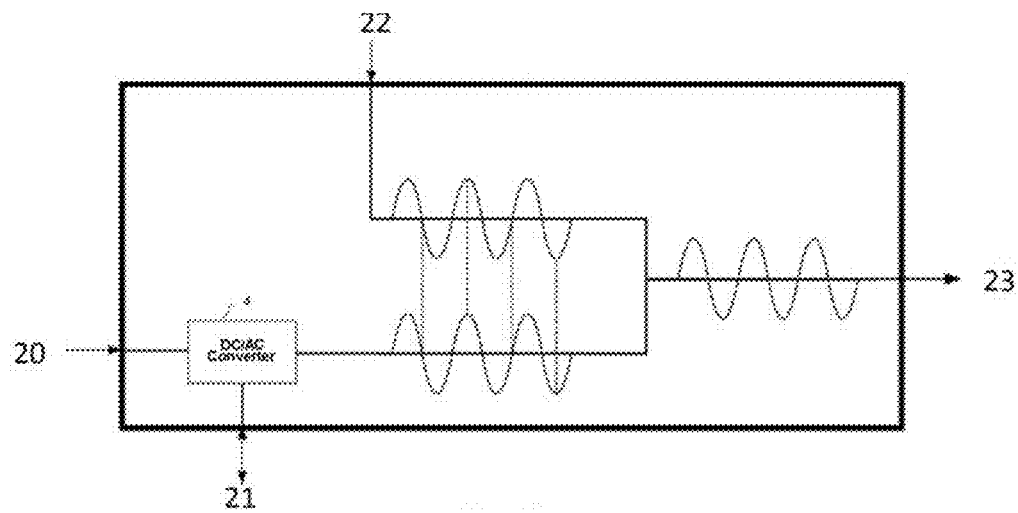
FIG. 3 represents the principle of multi-source phase coupling energy.

FIG. 3 shows the multi-source phase coupling energy (PCE). The coupling allows multiple power sources to be coupled, for example the power source 20, the batteries 21 and the electrical grid 22 to be coupled.

The PCE provides the housing with stability in order to guarantee a constant power supply and optimum efficiency.

When the amount of power consumed at the electrical output 23 is higher than the amount of power generated by the power source 20, such as photovoltaic panels for example, and the batteries 21 are not enough to meet the demand after passing through the DC/AC converter (4), then the system adds the current at the output of the DC/AC converter 4 to the current from the electrical grid 22, since they are in phase.

When the amount of power consumed at the electrical output 23 is lower than the amount of power generated by the power source 20, such as photovoltaic panels for example, and the batteries 21 are fully charged, after passing through the DC/AC converter 4, then the system supplies power to the electrical output 23 using the photovoltaic current passed through the DC/AC converter 4. The surplus current is then reinjected into the electrical grid 22, since they are in phase.

The multi-source coupling also allows the system to accept at output double its nominal power at constant draw:

- when the amount of power consumed at the electrical output 23 is lower than 3 kW, it is supplied by the photovoltaic panels and/or the batteries 21, depending on the chosen priorities. If the photovoltaic panels and the batteries 21 are not enough, then the electrical grid 22 takes over, depending on the chosen priorities;
- when the amount of power consumed at the electrical output 23 is higher than 3 kW, it is supplied by the photovoltaic panels and/or the batteries 21, depending on the chosen priorities, at a rate of 3 kW maximum. If the photovoltaic panels and the batteries 21 are not enough, then the electrical grid 22 takes over, depending on the chosen priorities. Additional requirements beyond 3 kW will be supplied by the electrical grid 22.

The multi-source coupling is able to manage and continues to operate normally in the event of a fault in, or the absence of, one of the sources. Thus, when the photovoltaic panels or the batteries 21, or even the electrical grid 23, is disconnected for whatever reason (exceedance of the authorized thresholds, external problem, etc.), then the multi-source coupling continues to supply the electrical output by compensating using the available sources.

Below are particular exemplary embodiments depending on the weather when the power source consists of solar panels:

Sunny Day:

The amount of power consumed by the electrical output 23 is higher than the amount of power generated by the photovoltaic cells. The generated power is supplied directly to the electrical output 23, then charges the batteries 21, then, when the batteries are fully charged, reinjects the excess into the electrical grid 22.

Day with Mixed Weather:

The amount of power generated by the photovoltaic panels is insufficient to supply the electrical output 23. The generated power is supplied directly to the electrical output 23 and the batteries 21 make up the remainder required by the electrical output 23.

Gloomy Day:

The amount of power generated by the photovoltaic panels is largely insufficient with respect to that consumed by the electrical output 23. The low amount of generated power is supplied directly to the electrical output 23, the batteries 21 make up a portion of the remainder required by the electrical output 23, aided by the electrical grid 22 in the event that the batteries 21 do not hold enough charge (below the threshold of 50% for example).

Night:

Power is supplied to the electrical output 23 by the batteries 21, aided by the electrical grid 22 in the event that the batteries 21 do not hold enough charge (below the threshold of 50% for example).

Absence of Grid:

The electrical grid 22 is absent. The generated power is supplied directly to the electrical output 23 and the batteries 21 make up the remainder required by the electrical output 23 until they are deeply discharged (80% for example).

Forced Charging of the Batteries:

In the timeslot in which the forced charging of the batteries 21 is scheduled, the electrical grid 22 charges the batteries 21 and simultaneously supplies power to the electrical output 23.

Figure 4:
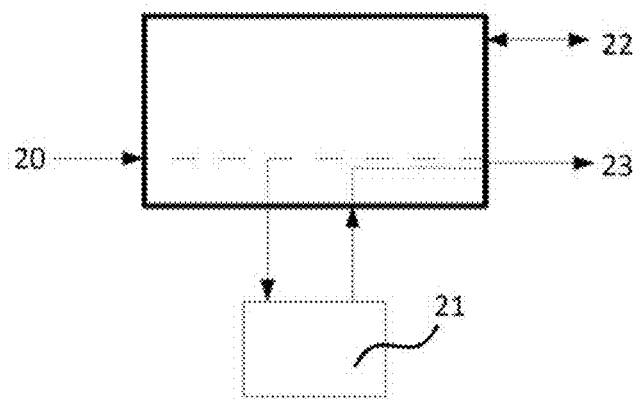
FIG. 4 is a schematic representation explaining efficiency.

FIG. 4 is a schematic representation of the battery recharging principle.

Specifically, smart management of the energy stored limits the use of the batteries 21. The system charges the batteries 21 solely using the excess power generated by the power source 20, and discharges them only when it is necessary to provide additional power to the electrical output 23.

This exemplary embodiment allows the storage capacity to be decreased, its lifespan to be extended by avoiding, as far as possible, drawing upon it (decreased number of cycles) and the overall efficiency of the system to be increased:

- when the amount of power consumed at the electrical output 23 is lower than the amount generated by the photovoltaic panels, the generated power is transferred directly to the electrical output 23 without passing through the batteries 21. Surplus power is used only to recharge the batteries 21;
- when the amount of power consumed at the electrical output 23 is higher than the amount generated by the photovoltaic panels, the generated power is transferred directly to the electrical output 23 without passing through the batteries 21 and the required additional power comes from these batteries 21.

In one exemplary embodiment, the efficiency of transfer of the power generated by the photovoltaics directly to the electrical output 23 is, at the maximum power point, 94.5%.

In one exemplary embodiment, the efficiency of transfer of the power generated by the photovoltaics directly to the electrical grid 22 is, at the maximum power point, 94.5%.

Thus, in the two preceding exemplary embodiments, for 1000 W generated by the power source 20, 945 W is recovered at the electrical output 23 or the electrical grid 22, respectively.

The efficiency of DC/DC conversion 7 between the photovoltaic panels and batteries 21 is, at the maximum power point, 94%. The efficiency of DC/AC conversion 4 between the batteries 21 and the electrical output is 93%.

Assuming that the efficiency of the batteries 21 is 80%, which is an average efficiency for a battery using lead/acid technology (depending on the model and on the technology, it may potentially reach 95% for batteries using lithium technology), the efficiency of transfer of the power generated by the photovoltaics through the batteries 21 in order to supply the electrical output 23 is 69.9% (0.94×0.93×0.80=0.699).

The overall efficiency of the setup, assuming that 50% of the generated power is consumed directly by the electrical output 23 and that 50% is stored in the batteries 21, is thus 82.2%. Thus, for 1000 W generated by the power source 20, 822 W is recovered at the electrical output 23.

The overall efficiency of the setup, assuming that 70% of the generated power is consumed directly by the electrical output 23 and that 30% is stored in the batteries 21, is thus 88.5%. Thus, for 1000 W generated by the power source 20, 885 W is recovered at the electrical output 23.

In comparison with the prior art, each of the components connected in series generates losses. In a traditional system (prior art), the regulator (losses of between 10% and 20%), the batteries (losses of around 20%) and an inverter (losses of between 10% and 15%) are placed in a succession, namely overall losses of between 35% and 45%. Using an MPPT regulator, a charger and an inverter within one and the same housing greatly decreases overall losses to 20%.

Figure 5:
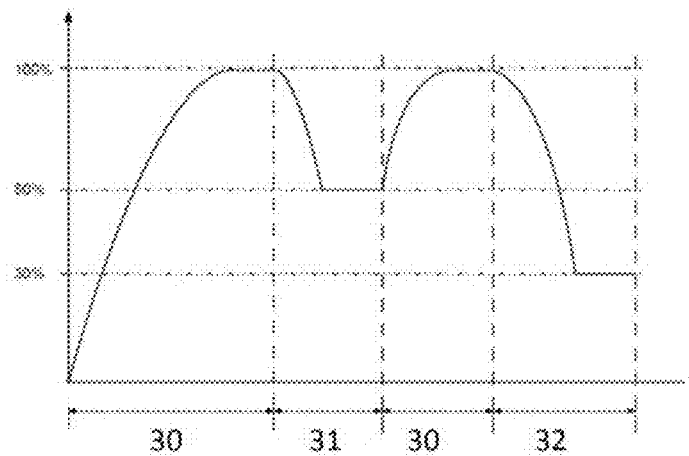
FIG. 5 is a schematic representation of the battery recharging principle.

FIG. 5 is a schematic representation of the battery charging principle.

According to one exemplary embodiment, the method includes two discharge threshold levels according to the availability of the electrical grid 22.

This configuration substantially increases the lifespan of the batteries 21 while favoring the autonomy of the system when needed.

The method additionally comprises a step of measuring the voltage and the frequency of the electrical grid which allows, in addition to the monitoring aspect, the presence or absence of the public grid to be verified.

When the electrical grid 22 is present, a depth of discharge is applied that is right for the batteries in order to favor the lifespan of the batteries 21, for example, 50% of the charge of the battery for lead/acid batteries.

When there is an outage of the electrical grid 22, a deeper discharge is automatically applied (for example 80% of the charge of the battery) in order to favor the autonomy of the system.

In the figure, the phase 30 shows the charge of the battery. The discharge phase 31 shows the phase of discharging the battery in the event that the electrical grid 23 is available. The discharge phase 32 shows the phase of discharging the battery in the event that the electrical grid 22 is not available.

In one exemplary embodiment, the method comprises a step of transmitting measurements of generated power and information on consumed power.

In one exemplary embodiment, the transmission is wireless allowing information on the measurements of generated power or on consumed power to be sent to a monitoring device. The remote link may be made over the Internet or via telecommunications networks. For example, when the monitoring device is a mobile phone, the transmission is an SMS (short message service) which provides information on generated power and consumed power. In another example, information on the system is transmitted in order to be collected and compared with a history of consumed and generated electricity.

In another exemplary embodiment, the transmission is wired (USB/RS232) in order to transmit information to the monitoring device.

For example, the monitoring device is a computer, mobile phone, tablet, or any other device allowing information to be read, such as a screen, etc.

In another exemplary embodiment, the monitoring device makes it possible to control the charging of the batteries.

Figure 6:
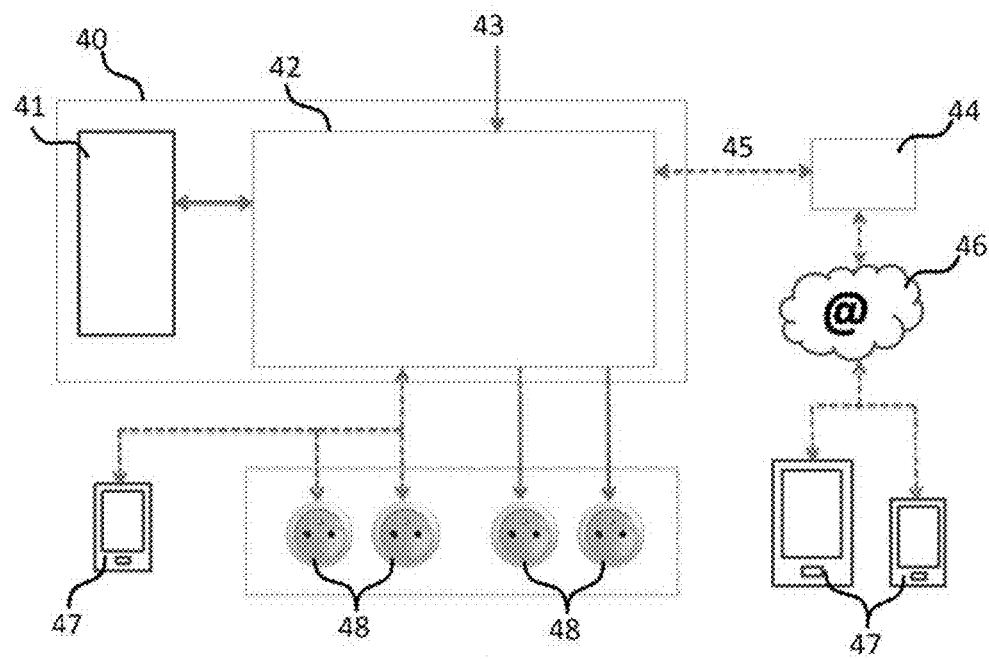
FIG. 6 is a schematic representation of the management of peak time and off-peak time.

FIG. 6 is a schematic representation integrating information on the peak time and off-peak time of an electricity meter.

The system includes a housing 40 comprising a microcontroller 41 and a management board 42 allowing electrical sockets 48 to be controlled. The management board makes it possible to integrate information. For example the information sent to the management board is: a request for load shedding, the hourly tariff of the public electricity grid, etc. The management board makes it possible to control the supply of power to the electrical sockets 48 depending on this hourly tariff.

The method takes the hourly tariff into account in order to use various strategies:
- when the public electricity grid sends information on a low hourly tariff, the system authorizes the forced charging of the batteries from the public electricity grid;
- when the public electricity grid sends information relating to a request for load shedding, the system allows the consumption of power from the public electricity grid to be decreased by shedding a portion of the output load;
- when the generated power is substantially higher than the consumed power, the system allows loads to be activated on command (water heater/heating/refrigerator/dishwasher, etc.).

A transmission of control information is transmitted to a monitoring device 47 in which data are displayed that relate to the supply of power to the electrical sockets, for example the electrical sockets supplying power to the water heater, the heating, the refrigerator, the freezer, the dishwasher, etc.

In one exemplary embodiment the transmission is made wirelessly via WI-FI® (for wireless communication protocols governed by the IEEE 802.11 standards, registered trademark).

When WI-FI® is used, it is linked to an Internet box 44 allowing access to the Internet 48 to be provided. In this way, the monitoring device 47 receives information via Wi-Fi or via the telecommunication network so as to display the information by connecting to the Internet.

In one exemplary embodiment, the transmission is made wirelessly via ZIGBEE® link (for a high-level protocol allowing small, low-power radios to communicate, based on the IEEE 802.15.4 standard for personal area networks, registered trademark).

In another exemplary embodiment, the electrical sockets 48 are controlled remotely by home networks, such as ZIGBEE and WI-FI.

Figure 7:
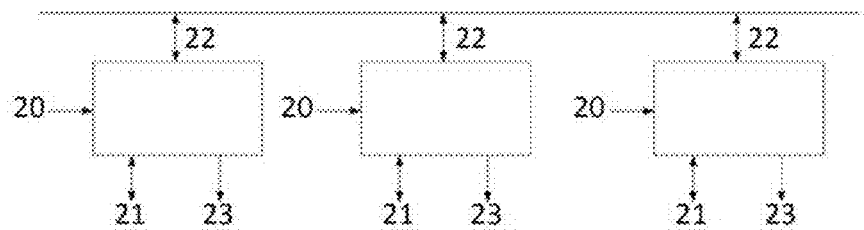
FIG. 7 is a schematic representation of multiple systems connected by an electrical grid.

FIG. 7 is a schematic representation of multiple systems connected by an electrical grid.

When multiple systems are connected in parallel at their electrical grid output 22, they interact with one another. There is a possibility to stabilise the electrical grid 22 in terms of voltage and frequency on command and via communication between the systems. When one of the systems lacks a battery 21 due to a high demand for power at the electrical output 23, another system having low power requirements at electrical output 23 sends its generated electricity 20 to the electrical grid output 22 so that the first system recovers this generated electricity instead of consuming power from the electrical grid 22 (since the current physically takes the shortest path, it will come first from the neighboring power source of the electrical grid 22). The greater the number of systems installed in parallel on site, the more stable the public electricity grid.

According to one exemplary embodiment, multiple housings are connected in parallel.

When the voltage of the public grid is low, a command allows all of the systems to inject power from the battery 21 and/or from the power source (20) into the electrical grid output 22 or by shedding loads in order to increase the voltage of the public electricity grid up to its nominal value.

When the voltage of the public grid is high, a command allows all of the systems to activate loads and/or to draw power from the public electricity grid in order to charge the battery 21 in order to decrease the voltage of the public electricity grid down to its nominal value.

When the frequency of the public grid is high, a command allows all of the systems to consume active power from the public electricity grid in order to charge the battery 21 in order to decrease the frequency of the public electricity grid down to its nominal value.

The term "high" is understood to mean that the frequency is up to 1% above its nominal value.

When the frequency of the public grid is low, a command allows all of the systems to inject active power into the public electricity grid from the battery 21 in order to increase the frequency of the public electricity grid up to its nominal value.

The term "low" is understood to mean that the frequency is up to 3% below its nominal value.

Figure 8:
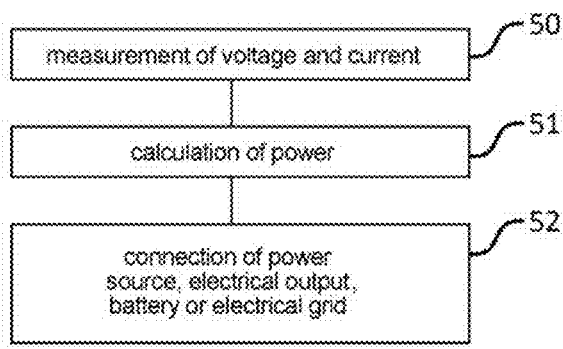
FIG. 8 is a flow chart showing steps implemented in one particular embodiment of the method that is the subject of the present invention.

FIG. 8 shows the steps of the method that is the subject of the present invention. It includes:
- a step 50 of measuring the voltage and the current of the power source, of the electrical output and of the battery;
- a step 51 of calculating the power of the power source, of the electrical output and of the battery;
- a step 52 of connecting the power source, the electrical output, the battery or the electrical grid.

According to one exemplary embodiment, when the battery 21 employs technology requiring a protection relay that consumes power at rest (for example a lithium battery: the battery produces electricity by way of the reversible exchange of lithium ions between two electrodes: an anode made of graphite and a cathode made of a metal oxide) and when the measurand of the voltage of the electrical source 20 is zero, a starter battery is connected in parallel to the lithium battery 21 in order to decrease the duration for which the protection relay of the battery 21 is closed and thus to increase its efficiency.

The term "protection relay" is understood to mean one or more relays integrated into market lithium batteries allowing the battery to be made safe (open: battery not operational, closed: battery operational). This relay consumes power; optimizing its use will allow an increase in efficiency.

Example 1

When the measurand of the voltage of the battery 21 is higher than a predetermined limit value, a command is sent to the battery 21 to open its protection relay: if the measurement of the voltage of the battery 21 is higher than the threshold of a charged battery (58 V for example) information is sent to the battery 21 to open its protection relay.

Example 2

If an amount of power is demanded at the electrical output 23 and the amount of power generated by the power source 22 is lower, the starter battery is used for a predetermined duration: if an amount of power is demanded at the electrical output 23 and the amount of power generated by the power source 22 is lower, the starter battery is used for example for 30 seconds.

Example 3

If the amount of power at the electrical output 23 remains higher than the amount of power generated by the power source 22 for this predetermined duration, a command is sent to the battery 21 to close the protection relay of the battery 21: if the amount of power at the electrical output 23 remains higher than the amount of power generated by the power source 22 for 30 seconds for example, a command is sent to the battery 21 to close a protection relay of the battery 21.

Example 4

When the measurand of the voltage of the battery 21 is lower than a predetermined limit value, a command is sent to the battery 21 to open its protection relay: when the measurand of the voltage of the battery 21 is lower than the end-of-use threshold of a battery (42 V for example), a command is sent to the battery 21 to open its protection relay.

Example 5

If power is demanded at the electrical output 23 and the measurand of the voltage of the starter battery is higher than a predetermined limit value and the power generated by the power source 22 added to a predetermined limit value is higher for a predetermined duration, a command is sent to the battery 21 to close the protection relay of the battery 21: if power is demanded at the electrical output 23 (1000 W) and the measurand of the voltage of the starter battery is higher than the predetermined limit value of a charged battery (58V for example: the battery is therefore charged) and the power generated by the power source 22 (1200 W) added to an offset of −50 W (1150 W) is higher than the power of the output 23 (1000 W) for 15 seconds, a command is sent to the battery 21 to close the protection relay of the battery 21 (allowing the battery 21 to be charged).

According to another exemplary embodiment, an aim of the present invention is a system for implementing the method, said system including a housing comprising:
 a device for tracking the maximum power point;
 a power phase coupling device;
 a charger; and
 an inverter.

Thus, the housing is simple to install and decreases the amount of wiring and programming. Overall losses are greatly decreased due to having everything integrated within one and the same housing.

The device for tracking the maximum power point (MPPT for maximum power point tracking) is a principle making it possible to track, as indicated by its name, the maximum power point of a non-linear electrical generator.

In another exemplary embodiment, the system comprises multiple housings.

Thus, the housings in proximity to one another recover generated electricity instead of consuming power from the electrical grid. Indeed, since the current physically takes the shortest path, it will come first from the neighboring power source of the electrical grid.

NOMENCLATURE

1 DC voltage generator
2 MPPT regulator
3 DC/DC converter
4 DC/AC converter
5 relay
6 grid connection connector
7 reversible DC/DC converter
8 relay
9 smart switch
10 AC OUTPUT connector
11 control board
12 smart slot
13 RS232/USB board
14 LCD screen
15 monitoring
20 power source
21 battery
22 electrical grid
23 electrical output
30 charging phase
31 discharging phase with electrical grid
32 discharging phase without electrical grid
40 housing
41 microcontroller
42 management board
43 information on peak or off-peak time
44 Internet box
45 Wi-Fi connection
46 Internet
47 monitoring device
48 power sockets
50 step of measuring electrical production
51 step of connecting the electricity flow
52 step of connecting the electrical output

The invention claimed is:

1. A power management method, comprising steps of:
 measuring voltages and currents of a power source, an electrical output and a battery;
 calculating a power generated by the power source, a power consumed by the electrical output and a power exchanged with the battery;
 connecting the power source, the electrical output, the battery and an electrical grid:
  the power source is connected to the electrical output to supply the electrical output with a power in response to a determination that the power generated by the power source is higher than the power consumed by the electrical output;
  the power source is connected to the battery to supply the battery with power in response to a determination that the power generated by the power source is higher than the power exchanged with the battery; or
  otherwise the power source is connected to the electrical grid;
 transmitting, to a monitoring device, measurements of electrical generation and information on consumption and control possibility of one or more remote systems;
 connecting the electrical output to the power source, the battery or the electrical grid in accordance with a tariff per kWh provided by a public electricity grid, wherein the electrical output is connected either to:
  the power source, then to the battery in response to determination that the power generated by the power source is lower than the power consumed by the electrical output, then to the electrical grid in response to determination that a measurand of a state of charge of the battery in the measuring step expressed as a percentage (%) is lower than a predetermined limit value in response to determination that the tariff per kWh is based on a peak time rate; or the power source, then to the electrical grid in response to determination that the power generated by the power source is lower than the power consumed by the electrical output in response to the determination that the tariff per kWh is based on an off-peak rate, then to the battery in response to determination that there is an outage on the electrical grid;

calculating a first remaining power by subtracting the power consumed by the electrical output from the power generated by the power source;

connecting the power source to the battery to provide the first remaining power to charge the battery in response to determination that the measurand of the state of charge of the battery is lower than the predetermined limit value and a measurand of the first remaining power is higher than zero;

calculating a second remaining power by subtracting the power exchanged with the battery from the first remaining power;

connecting the power source to the electric grid to provide the second remaining power to the electrical grid in response to determination that a measurand of the second remaining power is higher than zero; and connecting the power source to the electric grid to provide the first remaining power to the electrical grid in response to determination that the measurand of the state of charge of the battery is higher than the predetermined limit value.

2. The method as claimed in claim 1, wherein the power source supplies power to the battery; and further comprising the steps of:

calculating a first remaining power by subtracting the power exchanged with the battery from the power generated by the power source;

connecting the power source to the electrical output to provide the first remaining power to the electrical output in response to determination that the first remaining power is higher than the power consumed by the electrical output;

calculating a second remaining power by subtracting the power consumed by the electrical output from the first remaining power; and connecting the power source to the electrical grid to provide the second remaining power to the electrical grid in response to determination that a measurand of the second remaining power is higher than zero.

3. The method as claimed in claim 1, further comprising the step of measuring the electrical grid; setting the predetermined limit value between 30% and 55% in response to determination that a measurand of the voltage of the electrical grid is higher than zero; and setting the predetermined limit value between 60% and 90% in response to determination the measurand of the voltage of the electric grid is zero.

4. The method as claimed in claim 3, wherein the predetermined limit value is set between 45% and 55% in response to determination that the measurand of the voltage of the electrical grid is higher than zero; and wherein the predetermined limit value is set between 75% and 85% in response to determination the measurand of the voltage of the electric grid is zero.

5. The method as claimed in claim 1, wherein the power source is a renewable power source.

6. The method as claimed in claim 5, wherein the renewable power source is a solar panel, a wind turbine or marine power.

7. The method as claimed in claim 1, wherein the battery employs a protection relay technology; and further comprising the steps of replacing the battery with a starter battery for a predetermined duration and transmitting information to the battery to open a protection relay of the battery in response to determination that:

a measurand of the voltage of the battery is higher than the predetermined limit value and the power consumed by the electrical output is lower than the power generated by the power source; or the measurand of the voltage of the battery is lower than the predetermined limit value and the power consumed by the electrical output is higher than the power generated by the power source for the predetermined duration.

8. A power management method, comprising steps of:

measuring voltages and currents of a power source, an electrical output and a battery;

calculating a power generated by the power source, a power consumed by the electrical output and a power exchanged with the battery;

connecting the power source, the electrical output, the battery and an electrical grid:

the power source is connected to the electrical output to supply the electrical output with a power in response to a determination that the power generated by the power source is higher than the power consumed by the electrical output;

the power source is connected to the battery to supply the battery with power in response to a determination that the power generated by the power source is higher than the power exchanged with the battery; or otherwise the power source is connected to the electrical grid;

transmitting, to a monitoring device, measurements of electrical generation and information on consumption and control possibility of one or more remote systems;

connecting the electrical output to the power source, the battery or the electrical grid in accordance with a tariff per kWh provided by a public electricity grid, wherein the electrical output is connected either to:

the power source, then to the battery in response to determination that the power generated by the power source is lower than the power consumed by the electrical output, then to the electrical grid in response to determination that a measurand of a state of charge of the battery in the measuring step expressed as a percentage (%) is lower than a predetermined limit value in response to determination that the tariff per kWh is based on a peak time rate; or the power source, then to the electrical grid in response to determination that the power generated by the power source is lower than the power consumed by the electrical output in response to the determination that the tariff per kWh is based on an off-peak rate, then to the battery in response to determination that there is an outage on the electrical grid;

calculating a first remaining power by subtracting the power exchanged with the battery from the power generated by the power source;

connecting the power source to the electrical output to provide the first remaining power to the electrical output in response to determination that the first remaining power is higher than the power consumed by the electrical output;

calculating a second remaining power by subtracting the power consumed by the electrical output from the first remaining power;

connecting the power source to the electrical grid to provide the second remaining power to the electrical grid in response to determination that a measurand of the second remaining power is higher than zero;

measuring the electrical grid;

setting the predetermined limit value between 30% and 55% in response to determination that a measurand of the voltage of the electrical grid is higher than zero; and setting the predetermined limit value between 60% and 90% in response to determination the measurand of the voltage of the electric grid is zero.

9. The method as claimed in claim 8, wherein the predetermined limit value is set between 45% and 55% in response to determination that the measurand of the voltage of the electrical grid is higher than zero; and wherein the predetermined limit value is set between 75% and 85% in response to determination the measurand of the voltage of the electric grid is zero.

10. The method as claimed in claim 8, wherein the power source is a renewable power source.

11. The method as claimed in claim 10, wherein the renewable power source is a solar panel, a wind turbine or marine power.

* * * * *